United States Patent
Morgan

[11] Patent Number: 5,918,153
[45] Date of Patent: Jun. 29, 1999

[54] HIGH DENSITY ELECTRONIC CIRCUIT AND PROCESS FOR MAKING

[75] Inventor: William P. Morgan, Albuquerque, N.M.

[73] Assignee: Sandia Corporation, Albuquerque, N.M.

[21] Appl. No.: 08/715,659

[22] Filed: Sep. 18, 1996

[51] Int. Cl.⁶ .................. H01L 21/324; H01L 21/477; H01L 21/26; H01L 21/42
[52] U.S. Cl. .................. 438/977; 438/117; 174/267; 361/764
[58] Field of Search .................. 438/618, 620, 438/621, 622, 623, 624, 625, 619, 667, 977, 117, 461, 98; 361/760, 761, 762, 764, 765; 174/250, 267

[56] References Cited

U.S. PATENT DOCUMENTS

| | | | |
|---|---|---|---|
| 5,077,598 | 12/1991 | Bartelink | 357/68 |
| 5,147,208 | 9/1992 | Bachler | 439/67 |
| 5,189,505 | 2/1993 | Bartelink | 257/419 |
| 5,334,804 | 8/1994 | Love et al. | 174/267 |
| 5,355,283 | 10/1994 | Marrs et al. | 361/760 |
| 5,434,452 | 7/1995 | Higgins, III | 257/773 |
| 5,487,999 | 1/1996 | Farnworth | 437/7 |
| 5,618,752 | 4/1997 | Gaul | 438/626 |
| 5,646,067 | 7/1997 | Gaul | 438/458 |
| 5,747,358 | 5/1998 | Gorrell et al. | 216/11 |
| 5,786,270 | 7/1998 | Gorrell et al. | 438/613 |

*Primary Examiner*—John F. Niebling
*Assistant Examiner*—John Murphy
*Attorney, Agent, or Firm*—V. Gerald Grafe

[57] ABSTRACT

High density circuits with posts that protrude beyond one surface of a substrate to provide easy mounting of devices such as integrated circuits. The posts also provide stress relief to accommodate differential thermal expansion. The process allows high interconnect density with fewer alignment restrictions and less wasted circuit area than previous processes. The resulting substrates can be test platforms for die testing and for multi-chip module substrate testing. The test platform can contain active components and emulate realistic operational conditions, replacing shorts/opens net testing.

22 Claims, 4 Drawing Sheets

HIGH DENSITY ELECTRONIC CIRCUIT AND PROCESS FOR MAKING

This invention was made with Government support under Contract DE-AC04-94AL85000 awarded by the U.S. Department of Energy. The Government has certain rights in the invention.

BACKGROUND OF THE INVENTION

This invention relates generally to the field of high density electronic circuitry, and more specifically to high density electronic circuitry adapted for mounting devices such as integrated circuits (ICs).

Historically, ICs communicated through input/output (I/O) pads located on the periphery of the IC. Each IC mounted on its own substrate. A circuit board then connected multiple ICs to form a system. Improvements to IC technology and increased system performance demands have made these historical practices impractical. Larger, more dense ICs eventually run out of periphery space for I/O pads. The routing of signals to periphery pads, then across a substrate to a circuit, then across the circuit to another IC adds to the complexity, capacitance, and inductance of the system. This increases the system cost and reduces the system performance.

ICs can be manufactured with I/O pads on the IC's face instead of just on its periphery. ICs can also mount face down on substrates so that the I/O pads can connect to the substrate. This technique, often called flip-chip mounting, can overcome the I/O density limitation of peripheral I/O pads. See, e.g., "Implementation of flip chip and chip scale technology", Sematech Joint Industry Standard J-STD-012. Direct placement of ICs to the substrate also offers other electrical and thermal advantages.

The direct placement of ICs onto the substrate can cause many problems, however. Differential expansion of the IC and the substrate can destroy the substrate-IC connection. The substrate-IC connection also depends on the planarity of the IC attachment points. The substrate must also provide high density interconnection circuitry to connect multiple ICs into one system.

Substrates have been made from the same material and by the same processes as the ICs. Differential expansion is not a problem, and high density interconnects are possible. See, e.g., Bartelink, U.S. Pat. No. 5,189,505 and U.S. Pat. No. 5,077,598. Substrates made this way can be very expensive, however, making them impractical for many applications.

Substrates made of materials different from the ICs can be less expensive, but must accommodate differential expansion. Some approaches mount ICs to the substrate with adhesive; this addresses the differential expansion problem but can cause other severe problems if the system later requires repair. See, e.g., Bachler, U.S. Pat. No. 5,147,208. Other approaches build on traditional printed wiring board technologies, but encounter circuit density limitations due to mechanical registration problems for through-hole vias and can suffer from differential expansion problems. See, e.g., Marrs, U.S. Pat. No. 5,355,283. Other approaches address the differential expansion problem by using raised interfacing features to provide stress relief. These all encounter limits on circuit density, feature height, alignment, or attachment point planarity. See, e.g., Bachler, U.S. Pat. No. 5,147,208; Higgins, U.S. Pat. No. 5,434,452; Farnworth, U.S. Pat. No. 5,487,999; Love et al., U.S. Pat. No. 5,334,804.

There is a need for improved electronic circuits and methods for making them. The improved methods must allow direct mounting of devices such as ICs and must accommodate differential expansion of the device and the circuit substrate. The circuits must provide high density interconnections among the devices, and the methods for making the circuits must allow inexpensive manufacture.

SUMMARY OF THE INVENTION

The present invention provides an improved process for forming high density electronic circuitry. The joining of a base layer to a sacrificial layer forms a substrate. A dielectric layer is added to the substrate by joining with the sacrificial layer. Pits are then formed in the substrate by removing material from the dielectric layer and the sacrificial layer but not from the base layer. The pits are metallized by filling or plating with a conductive material. The conductive material metallizing the pits forms posts for mechanically mounting and electrically connecting ICs. A circuit layer can be formed on the dielectric layer to make desired connections between the posts and other external connections. Additional dielectric and circuit layers can be added to the substrate, with similar filled pits for connecting integrated circuits to the circuitry on each circuit layer. After all the dielectric and circuit layers have been added the base layer and sacrificial layer are removed, leaving posts electrically connected to the circuit layers and protruding from the substrate. Integrated circuits can be mounted with the posts, forming a high density system.

The base layer can be a conductive material that can be easily removed to expose the sacrificial layer. The sacrificial layer can be acrylic or epoxy or other material that can be removed preferentially with respect to the dielectric layer. The dielectric layers can be polyimide or other materials with suitable thermal, mechanical, and electrical properties. The pits can be formed by lasing or by chemical etching. They can be filled with copper or other electrical conductors. Circuits can be formed by selective plating and by print and etch processing, for example. The protruding mounting posts and flexible substrate accommodates differential thermal expansion. The simultaneous plating of pits and electrical connections and the repeated use of common reference datums for alignment of pits and electrical connections in all dielectric and circuit layers eliminates the need for large capture vias, allowing high density circuits. The raised mounting features are all referenced to the base layer, so they are highly coplanar for reliable attachment of devices.

DESCRIPTION OF THE FIGURES

The accompanying drawings, which are incorporated into and form part of the specification, illustrate embodiments of the invention and, together with the description, serve to better explain the present invention.

DETAILED DESCRIPTION OF THE INVENTION

The present invention provides a process for forming a high density electronic circuit suitable for mounting and interconnecting devices such as integrated circuits (ICs). The process forms posts adapted for mounting ICs or other devices on a substrate. The process can also provide electrical connections between ICs and other devices attached to the posts and to the associated electronics. The posts can be located at specific places on the substrate. The posts provide highly coplanar attachment points. The process uses common reference datums for all steps, eliminating wasted space required to accommodate cumulative reference tolerances. The substrate and mounted devices can be made to be self-aligning through the use of conical alignment posts on the substrate and corresponding alignment slots in the mounted devices.

Figure 1A:
FIGS. 1(a–d) show a sequence of steps for making a first high density circuit according to the present invention.

FIG. 1(a) shows a cross section of a substrate S formed by joining a base layer 100, a sacrificial layer 101, and a dielectric layer 102. The base layer 100 preferably is a good conductor and preferably is easy to dissolve (e.g., copper). The sacrificial layer 101 is preferably of a material that is easy to lase or etch and that dissolves preferentially with respect to the dielectric layer 102, and can be made from acrylic or epoxy, for example. The dielectric layer 102 preferably is of a material that is chemically stable in plating, etching, and sacrificial layer removal processes and that has thermal, mechanical, and dielectric properties compatible with mounted devices and intended electronic circuitry. The dielectric layer 102 can be made from polyimide, for example.

Figure 1B:
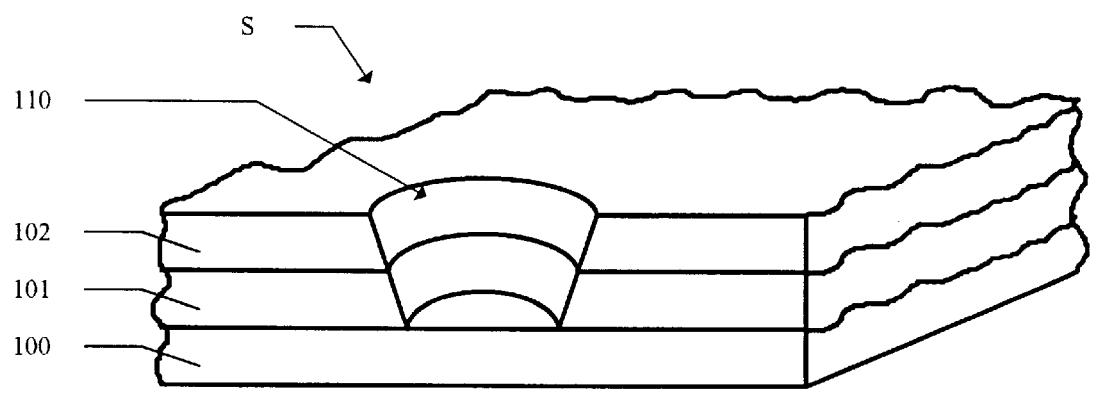

FIG. 1(b) shows substrate S of FIG. 1(a) after pits, such as pit 110, have been formed at selected locations. The locations can correspond to IC attachment points or test points, for example. The pits 110 can be formed by lasing, etching, plasma processing, or other suitable material removal processes known to those skilled in the art. The pits 110 penetrate the dielectric layer 102 and the sacrificial layer 101 but not the base layer 100. As an example, a $CO_2$, excimer, or YAG laser can form pits 110 in a polyimide dielectric layer 102 and an acrylic or epoxy sacrificial layer 101 with a copper base layer 100. The resulting pits 110 can be conical or cylindrical. A subsequent process step metallizes the pits 110 and forms posts (not shown) that have a geometry congruent to that of the pits 110. Conical pits can be easier to metallize than cylindrical pits, and can also provide mechanical interlocking with other layers. Conical posts can also allow mounted devices to self align. Cylindrical pits can make more efficient use of available space, however.

Figure 1C:
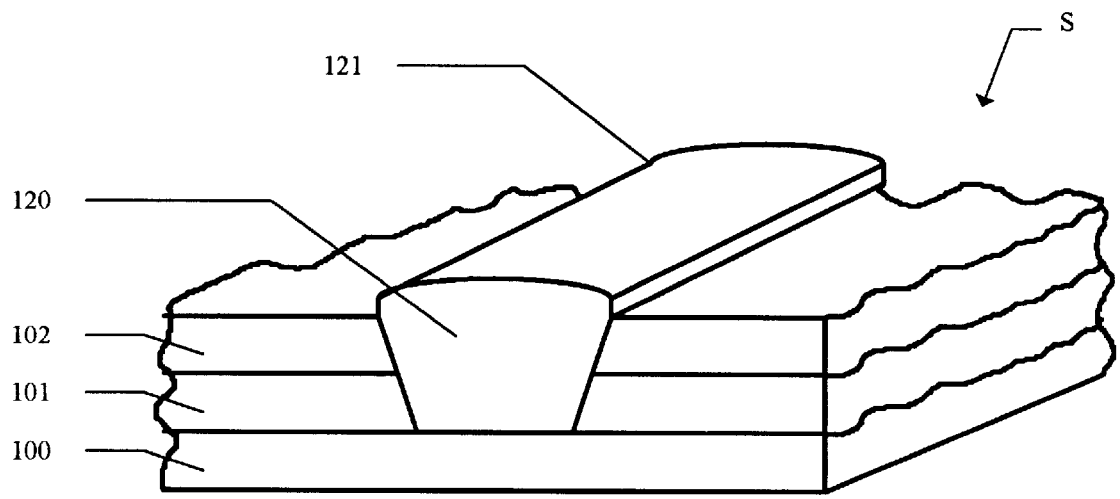

FIG. 1(c) shows substrate S of FIG. 1(b) after addition of a conductive material thereon. Conductive material 120 metallizes the pits (either by plating the pit walls or by filling the entire pit, as shown). Conductive material 121 on the surface of the dielectric layer 102 can form electrical connections between the metallized pits 110. The pit walls and electrical connections can be metallized in various ways. Palladium doped organic or inorganic carriers and solvents can be blanket applied in the pits and on the dielectric surface, or the pit walls and dielectric surface can be activated by a stannic/palladium electroless process. Well known photoresist and photolithography techniques can be used to electroplate conductors and pit walls. Alternatively, palladium doped organic or inorganic carriers and solvents can be selectively applied only in the pits and the areas selected for electrical connections, dried, and thermally activated. Plating will then occur only in the activated areas. A palladium doped carrier can also be blanket applied, then selectively thermally activated with a laser. See, e.g., Tokas et al., U.S. Pat. No. 5,348,574. The pit walls and electrical connections can be metallized simultaneously to strengthen the electrical and mechanical bond between them.

Figure 1D:
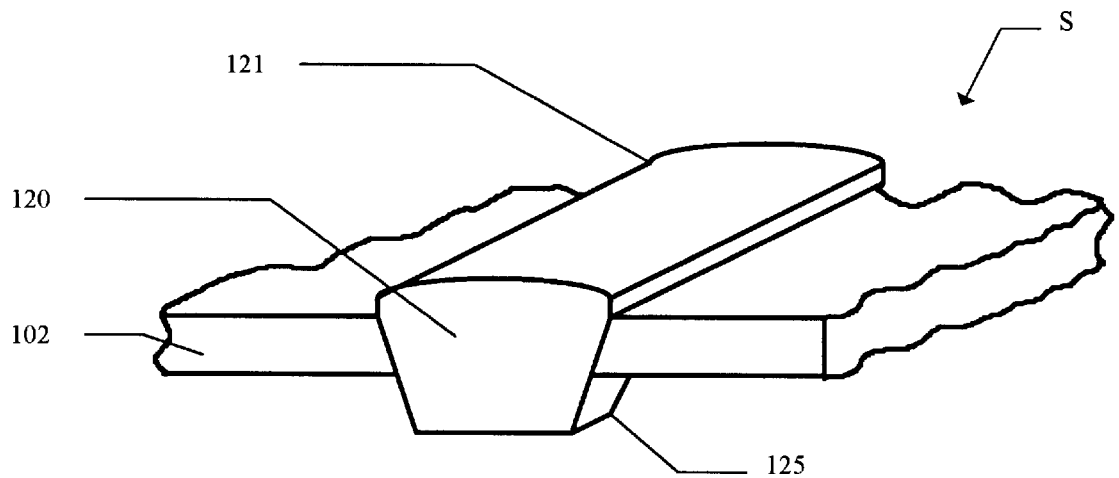

FIG. 1(d) shows substrate S after removal of the base layer 100 and sacrificial layer 101 of FIG. 1(c). The base layer 100 and sacrificial layer 101 can be removed by processes such as dissolution known to those skilled in the art. Conductive material 120 that metallized the pit now protrudes beyond one surface of the dielectric layer 102 to form a post 125. Conductive material 121 on the other surface of the dielectric layer 102 forms electrical connections between posts such as post 125. The post 125 provides an electrical and mechanical mounting point for devices such as ICs. Devices can be mounted with surface mount techniques known to those skilled in the art. The posts 125 can also be used to align devices to be mounted to the substrate by matching the location and shape of a post to a corresponding feature on a device. Mounting on posts 125 provides mechanical stress relief for accommodating differential expansion, and provides space between the device and the substrate for an encapsulating underfill that can also help accommodate differential expansion and isolate stresses away from solder connections. Flexibility of the dielectric layer 102 also helps accommodate differential expansion.

Figure 2A:
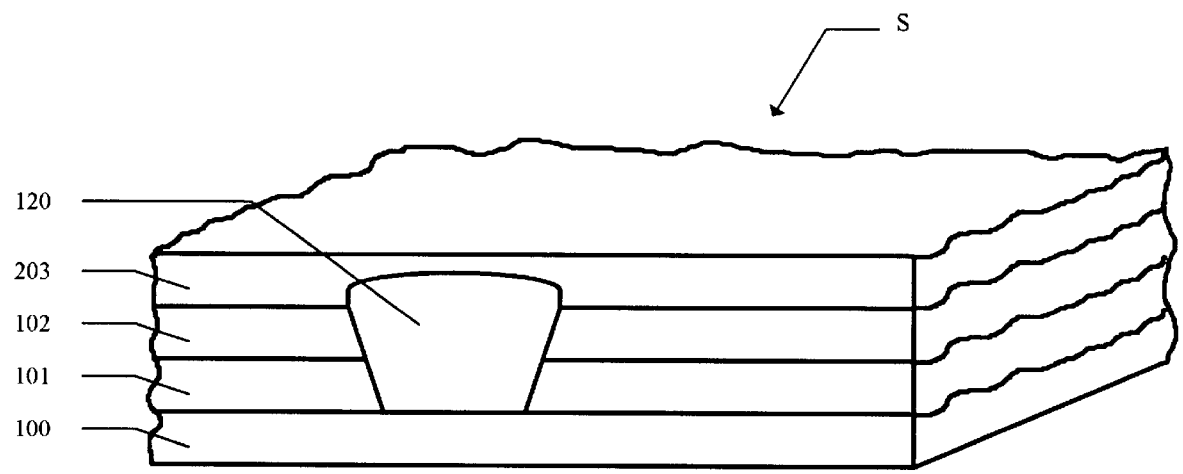
FIGS. 2(a–d) show a sequence of steps for making a second high density circuit according to the present invention.

FIG. 2(a) shows a substrate S after the processing of FIG. 1(c) and after the addition of an additional dielectric layer 203. The additional dielectric layer 203 is preferably of a material that is nonconductive and that has similar chemical, thermal, mechanical, and dielectric properties as the other dielectric layers. It is added to the surface of substrate S after conductive material 120 metallizing the pits and after conductive material forming electrical connections (not shown).

Figure 2B:
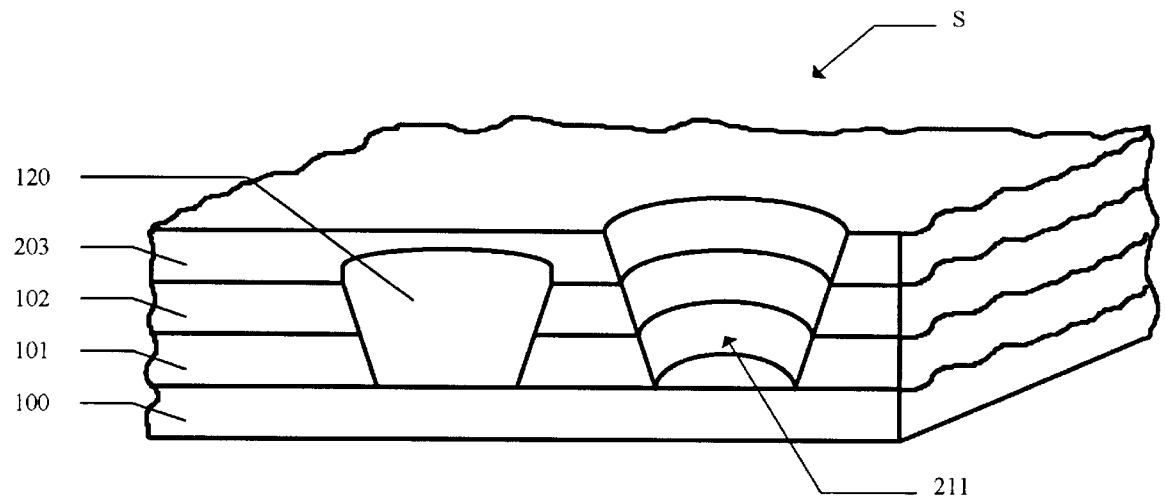

In FIG. 2(b) a pit 211 has been formed in substrate S of FIG. 2(a). The pit 211 penetrates the sacrificial layer 101 and both dielectric layers 102, 203, but not the base layer 100. The pit 211 can be formed by methods previously discussed.

Figure 2C:
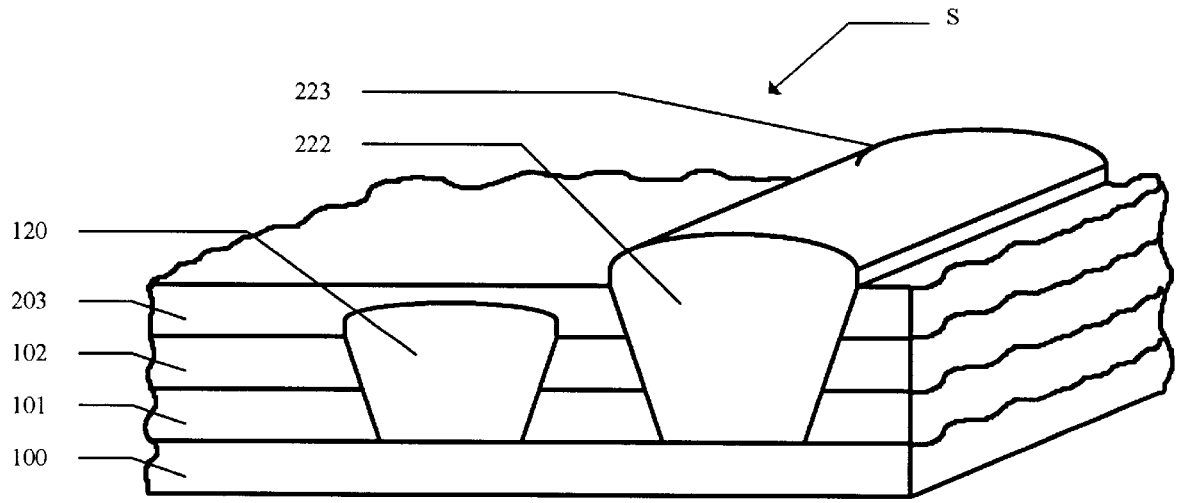

In FIG. 2(c) a conductive material has been added to the substrate S. The conductive material 222 metallizes the pit and can form electrical connections 223 on the surface of the dielectric layer 203. The conductive material 222, 223 can be added by methods such as those previously discussed. The conductive material 222 in the pit can also connect to electrical connections (not shown) in previous layers to form connections between layers. The steps shown in FIGS. 2(a–c) can be repeated to add more dielectric layers, pits, and electrical connections.

Figure 2D:
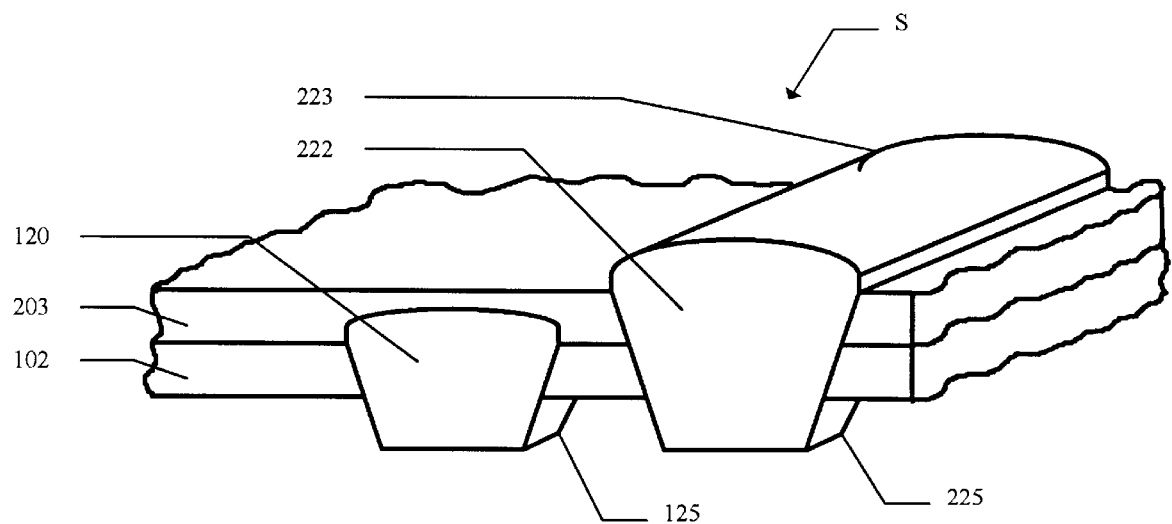

FIG. 2(d) shows substrate S after removal of the base layer 100 and sacrificial layer 101 of FIG. 2(c). They can be removed as previously discussed. The conductive material 120, 222 in the pits protrudes beyond the surface of the dielectric layer 202 to form posts 125, 225, offering benefits as previously discussed.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

I claim:

1. A process for fabricating high density circuits, comprising:
    a) joining a base layer of a first material to one side of a sacrificial layer of a second material;
    b) joining a first dielectric layer of a third material to the other side of the sacrificial layer to form a substrate;
    c) forming one or more pits in the substrate extending through the sacrificial layer and the first dielectric layer but not the base layer;
    d) metallizing the pits with a conductive material;
    e) removing the base layer and the sacrificial layer from the substrate.

2. The process of claim 1, wherein the pits are formed by a process chosen from the group consisting of: chemical etching, plasma processing, and laser material removal.

3. The process of claim 1, wherein the pits are formed by removing material with a laser chosen from the group consisting of: $CO_2$, excimer, and YAG.

4. The process of claim 1, wherein the pits are metallized by electrochemical deposition.

5. The process of claim 1, where the first material is copper.

6. The process of claim 1, where the second material is acrylic.

7. The process of claim 1, where the third material is polyimide.

8. The process of claim 1, where the conductive material is chosen from the group consisting of: copper, gold, silver, nickel, and alloys thereof.

9. The process of claim 1, where pits are conical.

10. The process of claim 1, further comprising the following steps before removing the base and sacrificial layers:
 a) joining a second dielectric layer to the substrate;
 b) forming one or more pits in the substrate extending through the sacrificial layer and the first and second dielectric layers but not the base layer;
 c) metallizing the pits.

11. The process of claim 10, wherein:
 a) the pits are formed by removing material with a laser chosen from the group consisting of: $CO_2$, excimer, and YAG;
 b) the pits are metallized by electrochemical deposition;
 c) the first material is copper, the second material is acrylic, and the third material is polyimide; and
 d) the conductive material is chosen from the group consisting of: copper, gold, silver, nickel, and alloys thereof.

12. A process for fabricating high density circuits, comprising:
 a) joining a base layer of a first material to one side of a sacrificial layer of a second material;
 b) joining a dielectric layer of a third material to the other side of the sacrificial layer to form a substrate, where the first and second materials dissolve preferentially with respect to the third material;
 c) forming one or more pits in the substrate extending through the sacrificial layer and the dielectric layer but not the base layer;
 d) metallizing the pits with a conductive material.

13. The process of claim 12, wherein the pits are formed by a process chosen from the group consisting of: chemical etching, plasma processing, and laser material removal.

14. The process of claim 12, wherein the pits are formed by removing material with a laser chosen from the group consisting of: $CO_2$, excimer, and YAG.

15. The process of claim 12, wherein the pits are metallized by electrochemical deposition.

16. The process of claim 12, where the first material is copper.

17. The process of claim 12, where the second material is acrylic.

18. The process of claim 12, where the third material is polyimide.

19. The process of claim 12, where the conductive material is chosen from the group consisting of: copper, gold, silver, nickel, and alloys thereof.

20. The process of claim 12, where pits are conical.

21. The process of claim 12, further comprising:
 a) joining a second dielectric layer to the substrate;
 b) forming one or more pits in the substrate extending through the sacrificial layer and the first and second dielectric layers but not the base layer;
 c) metallizing the pits.

22. The process of claim 21, wherein:
 a) the pits are formed by removing material with a laser chosen from the group consisting of: $CO_2$, excimer, and YAG;
 b) the pits are metallized by electrochemical deposition;
 c) the first material is copper, the second material is acrylic, and the third material is polyimide; and
 d) the conductive material is chosen from the group consisting of: copper, gold, silver, nickel, and alloys thereof.

* * * * *